US009614589B1

United States Patent
Russo et al.

(10) Patent No.: US 9,614,589 B1
(45) Date of Patent: Apr. 4, 2017

(54) COMMUNICATION VIA A MAGNIO

(71) Applicant: Lockheed Martin Corporation, Bethesda, MD (US)

(72) Inventors: Jon C. Russo, Cherry Hill, NJ (US); Gregory S. Bruce, Abington, PA (US); David N. Coar, Cherry Hill, NJ (US); Wilbur Lew, Mount Laurel, NJ (US); Julie L. Miller, Auberry, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/003,677

(22) Filed: Jan. 21, 2016

Related U.S. Application Data

(60) Provisional application No. 62/261,643, filed on Dec. 1, 2015.

(51) Int. Cl.
H04B 5/00 (2006.01)

(52) U.S. Cl.
CPC ......... *H04B 5/0031* (2013.01); *H04B 5/0075* (2013.01); *H04B 5/0081* (2013.01)

(58) Field of Classification Search
CPC combination set(s) only.
See application file for complete search history.

(56) References Cited

U.S. PATENT DOCUMENTS

| | | | |
|---|---|---|---|
| 2,746,027 A | 5/1956 | Murray | |
| 3,389,333 A | 6/1968 | Wolff et al. | |
| 3,514,723 A | 5/1970 | Cutler | |
| 3,518,531 A | 6/1970 | Huggett | |
| 3,745,452 A | 7/1973 | Osburn et al. | |
| 3,899,758 A | 8/1975 | Maier et al. | |
| 4,078,247 A | 3/1978 | Albrecht | |
| 4,084,215 A | 4/1978 | Willenbrock | |
| 4,329,173 A | 5/1982 | Culling | |
| 4,368,430 A | 1/1983 | Dale et al. | |
| 4,514,083 A | 4/1985 | Fukuoka | |
| 4,588,993 A | 5/1986 | Babij et al. | |
| 4,638,324 A | 1/1987 | Hannan | |
| 4,675,522 A | 6/1987 | Arunkumar | |

(Continued)

FOREIGN PATENT DOCUMENTS

| | | |
|---|---|---|
| DE | 69608006 T2 | 2/2001 |
| DE | 19600241 C2 | 8/2002 |

(Continued)

OTHER PUBLICATIONS

Acosta et al., "Broadband magnetometry by infrared-absorption detection of nitrogen-vacancy ensembles in diamond," Appl. Phys. Letters 97: 174104 (Oct. 29, 2010), 4 pages.

(Continued)

*Primary Examiner* — Yuwen Pan
*Assistant Examiner* — Zhitong Chen
(74) *Attorney, Agent, or Firm* — Foley & Lardner LLP

(57) ABSTRACT

A system includes a transmitting device and a receiving device. The transmitting device includes a first processor configured to transmit data to a transmitter and the transmitter. The transmitter is configured to transmit the data via a magnetic field. The receiving device includes a magnetometer configured to detect the magnetic field and a second processor configured to decipher the data from the detected magnetic field.

16 Claims, 5 Drawing Sheets

(56) References Cited

U.S. PATENT DOCUMENTS

| | | | |
|---|---|---|---|
| 4,945,305 A | 7/1990 | Blood | |
| 5,019,721 A | 5/1991 | Martens et al. | |
| 5,038,103 A | 8/1991 | Scarzello et al. | |
| 5,113,136 A | 5/1992 | Hayashi et al. | |
| 5,134,369 A | 7/1992 | Lo et al. | |
| 5,189,368 A | 2/1993 | Chase | |
| 5,245,347 A | 9/1993 | Bonta et al. | |
| 5,252,912 A | 10/1993 | Merritt et al. | |
| 5,301,096 A | 4/1994 | Klontz et al. | |
| 5,384,109 A | 1/1995 | Klaveness et al. | |
| 5,396,802 A | 3/1995 | Moss | |
| 5,568,516 A | 10/1996 | Strohallen et al. | |
| 5,694,375 A | 12/1997 | Woodall | |
| 5,818,352 A | 10/1998 | McClure | |
| 5,907,420 A | 5/1999 | Chraplyvy et al. | |
| 6,057,684 A | 5/2000 | Murakami et al. | |
| 6,124,862 A | 9/2000 | Boyken et al. | |
| 6,130,753 A | 10/2000 | Hopkins, Jr. et al. | |
| 6,195,231 B1 | 2/2001 | Sedlmayr et al. | |
| 6,360,173 B1 | 3/2002 | Fullerton | |
| 6,398,155 B1 | 6/2002 | Hepner et al. | |
| 6,433,944 B1 | 8/2002 | Nagao et al. | |
| 6,504,365 B2 | 1/2003 | Kitamura | |
| 6,542,242 B1 | 4/2003 | Yost et al. | |
| 6,636,146 B1 | 10/2003 | Wehoski | |
| 6,686,696 B2 | 2/2004 | Mearini et al. | |
| 6,690,162 B1 | 2/2004 | Schopohl et al. | |
| 7,118,657 B2 | 10/2006 | Golovchenko et al. | |
| 7,221,164 B1 | 5/2007 | Barringer | |
| 7,277,161 B2 | 10/2007 | Claus | |
| 7,305,869 B1 | 12/2007 | Berman et al. | |
| 7,307,416 B2 | 12/2007 | Islam et al. | |
| RE40,343 E | 5/2008 | Anderson | |
| 7,413,011 B1 | 8/2008 | Chee et al. | |
| 7,427,525 B2 | 9/2008 | Santori et al. | |
| 7,448,548 B1 | 11/2008 | Compton | |
| 7,471,805 B2 | 12/2008 | Goldberg | |
| 7,474,090 B2 | 1/2009 | Islam et al. | |
| 7,543,780 B1 | 6/2009 | Marshall et al. | |
| 7,546,000 B2 | 6/2009 | Spillane et al. | |
| 7,983,812 B2 | 7/2011 | Potter | |
| 8,120,351 B2 | 2/2012 | Rettig et al. | |
| 8,120,355 B1 | 2/2012 | Stetson | |
| 8,138,756 B2 | 3/2012 | Barclay et al. | |
| 8,294,306 B2 | 10/2012 | Kumar et al. | |
| 8,311,767 B1 | 11/2012 | Stetson | |
| 8,334,690 B2 | 12/2012 | Kitching et al. | |
| 8,415,640 B2 | 4/2013 | Babinec et al. | |
| 8,471,137 B2 | 6/2013 | Adair et al. | |
| 8,480,653 B2 | 7/2013 | Birchard et al. | |
| 8,525,516 B2 | 9/2013 | Le Prado et al. | |
| 8,547,090 B2 | 10/2013 | Lukin et al. | |
| 8,574,536 B2 | 11/2013 | Boudou et al. | |
| 8,575,929 B1 | 11/2013 | Wiegert | |
| 8,686,377 B2 | 4/2014 | Twitchen et al. | |
| 8,758,509 B2 | 6/2014 | Twitchen et al. | |
| 8,803,513 B2 | 8/2014 | Hosek et al. | |
| 8,885,301 B1 | 11/2014 | Heidmann | |
| 8,913,900 B2 | 12/2014 | Lukin et al. | |
| 8,933,594 B2 | 1/2015 | Kurs | |
| 8,947,080 B2 | 2/2015 | Lukin et al. | |
| 8,963,488 B2 | 2/2015 | Campanella et al. | |
| 9,157,859 B2 | 10/2015 | Walsworth et al. | |
| 9,245,551 B2 | 1/2016 | El Hallak et al. | |
| 2002/0167306 A1 | 11/2002 | Zalunardo et al. | |
| 2003/0058346 A1 | 3/2003 | Bechtel et al. | |
| 2003/0076229 A1 | 4/2003 | Blanpain et al. | |
| 2003/0235136 A1 | 12/2003 | Akselrod et al. | |
| 2004/0013180 A1* | 1/2004 | Giannakis | H04L 1/0054 375/219 |
| 2004/0022179 A1* | 2/2004 | Giannakis | H03M 13/29 370/207 |
| 2004/0042150 A1 | 3/2004 | Swinbanks et al. | |
| 2004/0109328 A1 | 6/2004 | Dahl et al. | |
| 2004/0247145 A1 | 12/2004 | Luo et al. | |
| 2005/0099177 A1 | 5/2005 | Greelish | |
| 2005/0126905 A1 | 6/2005 | Golovchenko et al. | |
| 2005/0130601 A1 | 6/2005 | Palermo et al. | |
| 2005/0134257 A1 | 6/2005 | Etherington et al. | |
| 2005/0146327 A1 | 7/2005 | Jakab | |
| 2006/0012385 A1 | 1/2006 | Tsao et al. | |
| 2006/0054789 A1 | 3/2006 | Miyamoto et al. | |
| 2006/0062084 A1 | 3/2006 | Drew | |
| 2006/0071709 A1 | 4/2006 | Maloberti et al. | |
| 2007/0004371 A1 | 1/2007 | Okanobu | |
| 2007/0247147 A1 | 10/2007 | Xiang et al. | |
| 2008/0016677 A1 | 1/2008 | Creighton | |
| 2008/0048640 A1 | 2/2008 | Hull et al. | |
| 2008/0078233 A1 | 4/2008 | Larson et al. | |
| 2008/0089367 A1 | 4/2008 | Srinivasan et al. | |
| 2008/0204004 A1* | 8/2008 | Anderson | A61B 90/36 324/207.13 |
| 2008/0217516 A1 | 9/2008 | Suzuki et al. | |
| 2008/0239265 A1 | 10/2008 | Den Boef | |
| 2008/0299904 A1* | 12/2008 | Yi | H01Q 7/06 455/41.1 |
| 2009/0042592 A1 | 2/2009 | Cho et al. | |
| 2009/0060790 A1 | 3/2009 | Okaguchi et al. | |
| 2009/0079417 A1 | 3/2009 | Mort et al. | |
| 2009/0079426 A1 | 3/2009 | Anderson | |
| 2009/0132100 A1 | 5/2009 | Shibata | |
| 2009/0277702 A1 | 11/2009 | Kanada et al. | |
| 2009/0310650 A1 | 12/2009 | Chester et al. | |
| 2010/0015918 A1 | 1/2010 | Liu et al. | |
| 2010/0045269 A1 | 2/2010 | Lafranchise et al. | |
| 2010/0134922 A1 | 6/2010 | Yamada et al. | |
| 2010/0157305 A1 | 6/2010 | Henderson | |
| 2010/0188081 A1 | 7/2010 | Lammegger | |
| 2010/0237149 A1 | 9/2010 | Olmstead | |
| 2010/0271016 A1 | 10/2010 | Barclay et al. | |
| 2010/0277121 A1 | 11/2010 | Hall et al. | |
| 2010/0308813 A1 | 12/2010 | Lukin et al. | |
| 2010/0315079 A1 | 12/2010 | Lukin et al. | |
| 2010/0326042 A1 | 12/2010 | Mclean et al. | |
| 2011/0034393 A1 | 2/2011 | Justen et al. | |
| 2011/0062957 A1 | 3/2011 | Fu et al. | |
| 2011/0063957 A1 | 3/2011 | Isshiki et al. | |
| 2011/0066379 A1 | 3/2011 | Mes | |
| 2011/0127999 A1 | 6/2011 | Lott et al. | |
| 2011/0165862 A1 | 7/2011 | Yu et al. | |
| 2011/0243267 A1 | 10/2011 | Won et al. | |
| 2011/0270078 A1 | 11/2011 | Wagenaar et al. | |
| 2012/0016538 A1 | 1/2012 | Waite et al. | |
| 2012/0019242 A1 | 1/2012 | Hollenberg et al. | |
| 2012/0037803 A1 | 2/2012 | Strickland | |
| 2012/0044014 A1 | 2/2012 | Stratakos et al. | |
| 2012/0051996 A1 | 3/2012 | Scarsbrook et al. | |
| 2012/0063505 A1 | 3/2012 | Okamura et al. | |
| 2012/0087449 A1 | 4/2012 | Ling et al. | |
| 2012/0089299 A1 | 4/2012 | Breed | |
| 2012/0140219 A1 | 6/2012 | Cleary | |
| 2012/0181020 A1 | 7/2012 | Barron et al. | |
| 2012/0194068 A1 | 8/2012 | Cheng et al. | |
| 2012/0235633 A1 | 9/2012 | Kesler et al. | |
| 2012/0235634 A1 | 9/2012 | Hall et al. | |
| 2012/0257683 A1 | 10/2012 | Schwager et al. | |
| 2012/0273826 A1 | 11/2012 | Yamamoto et al. | |
| 2012/0281843 A1 | 11/2012 | Christensen et al. | |
| 2012/0326793 A1 | 12/2012 | Gan | |
| 2013/0127518 A1 | 5/2013 | Nakao | |
| 2013/0215712 A1 | 8/2013 | Geiser et al. | |
| 2013/0265782 A1 | 10/2013 | Barrena et al. | |
| 2014/0012505 A1 | 1/2014 | Smith et al. | |
| 2014/0037932 A1 | 2/2014 | Twitchen et al. | |
| 2014/0061510 A1 | 3/2014 | Twitchen et al. | |
| 2014/0072008 A1 | 3/2014 | Faraon et al. | |
| 2014/0077231 A1 | 3/2014 | Twitchen et al. | |
| 2014/0081592 A1 | 3/2014 | Bellusci et al. | |
| 2014/0104008 A1 | 4/2014 | Gan | |
| 2014/0126334 A1 | 5/2014 | Megdal et al. | |
| 2014/0139322 A1 | 5/2014 | Wang et al. | |
| 2014/0159652 A1 | 6/2014 | Hall et al. | |
| 2014/0166904 A1 | 6/2014 | Walsworth et al. | |
| 2014/0167759 A1 | 6/2014 | Pines et al. | |

(56) References Cited

U.S. PATENT DOCUMENTS

| | | |
|---|---|---|
| 2014/0168174 A1 | 6/2014 | Idzik et al. |
| 2014/0191139 A1 | 7/2014 | Englund |
| 2014/0191752 A1 | 7/2014 | Walsworth et al. |
| 2014/0198463 A1 | 7/2014 | Klein |
| 2014/0215985 A1 | 8/2014 | Pollklas |
| 2014/0247094 A1 | 9/2014 | Englund et al. |
| 2014/0265555 A1 | 9/2014 | Hall et al. |
| 2014/0272119 A1 | 9/2014 | Kushalappa et al. |
| 2014/0273826 A1* | 9/2014 | Want ............... H04B 5/0056 455/41.1 |
| 2014/0297067 A1 | 10/2014 | Malay |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1 | 1/2015 | Englund et al. |
| 2015/0009746 A1 | 1/2015 | Kucsko et al. |
| 2015/0018018 A1 | 1/2015 | Shen et al. |
| 2015/0048822 A1 | 2/2015 | Walsworth et al. |
| 2015/0054355 A1 | 2/2015 | Ben-Shalom et al. |
| 2015/0090033 A1 | 4/2015 | Budker et al. |
| 2015/0128431 A1 | 5/2015 | Kuo |
| 2015/0137793 A1 | 5/2015 | Englund et al. |
| 2015/0192532 A1 | 7/2015 | Clevenson et al. |
| 2015/0192596 A1 | 7/2015 | Englund et al. |
| 2015/0225052 A1 | 8/2015 | Cordell |
| 2015/0235661 A1 | 8/2015 | Heidmann |
| 2015/0253355 A1 | 9/2015 | Grinolds et al. |
| 2015/0268373 A1 | 9/2015 | Meyer |
| 2015/0269957 A1 | 9/2015 | El Hallak et al. |
| 2015/0276897 A1 | 10/2015 | Leussler et al. |
| 2015/0299894 A1 | 10/2015 | Markham et al. |
| 2015/0374250 A1 | 12/2015 | Hatano et al. |
| 2016/0216341 A1 | 7/2016 | Boesch et al. |
| 2016/0221441 A1 | 8/2016 | Hall et al. |
| 2016/0348277 A1 | 12/2016 | Markham et al. |

FOREIGN PATENT DOCUMENTS

| | | |
|---|---|---|
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 685 597 | 8/2006 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |
| EP | 2 707 523 | 3/2014 |
| EP | 2 745 360 | 6/2014 |
| EP | 2 769 417 | 8/2014 |
| EP | 2 790 031 | 10/2014 |
| EP | 2 837 930 | 2/2015 |
| EP | 2 907 792 | 8/2015 |
| GB | 2 433 737 | 7/2007 |
| GB | 2 482 596 | 2/2012 |
| GB | 2 483 767 | 3/2012 |
| GB | 2 486 794 | 6/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2011/046403 A2 | 4/2011 |
| WO | WO-2011/153339 | 12/2011 |
| WO | WO-2012/016977 A2 | 2/2012 |
| WO | WO-2012/084750 | 6/2012 |
| WO | WO-2013/066446 A1 | 5/2013 |
| WO | WO-2013/066448 | 5/2013 |
| WO | WO-2013/093136 A1 | 6/2013 |
| WO | WO-2013/188732 A1 | 12/2013 |
| WO | WO-2014/011286 A2 | 1/2014 |
| WO | WO-2014/099110 A2 | 6/2014 |
| WO | WO-2014/135544 A1 | 9/2014 |
| WO | WO-2014/135547 A1 | 9/2014 |
| WO | WO-2014/166883 A1 | 10/2014 |
| WO | WO-2014/210486 A1 | 12/2014 |
| WO | WO-2015/015172 A1 | 2/2015 |
| WO | WO-2015/158383 A1 | 10/2015 |
| WO | WO-2015/193156 A1 | 12/2015 |

OTHER PUBLICATIONS

Barry et al., "Optical magnetic detection of single-neuron action potentials using quantum defects in diamond," as submitted to Quantum Physics on Feb. 2, 2016, 23 pages.

Constable, "Geomagnetic Spectrum, Temporal." In Encyclopedia of Geomagnetism and Paleomagnetism, pp. 353-355, Springer: Dordrecht, Netherlands (2007).

International Search Report and Written Opinion of the International Searching Authority dated Apr. 1, 2016 from related PCT application PCT/US2016/014384, 12 pages.

International Search Report and Written Opinion of the International Searching Authority dated Apr. 11, 2016 from related PCT application PCT/US2016/014376, 12 pages.

International Search Report and Written Opinion of the International Searching Authority dated Apr. 11, 2016 from related PCT application PCT/US2016/014395, 15 pages.

International Search Report and Written Opinion of the International Searching Authority dated Jul. 6, 2015, from related PCT application PCT/US2015/021093, 9 pages.

International Search Report and Written Opinion of the International Searching Authority dated Jul. 8, 2015, from related PCT application PCT/US2015/024265, 11 pages.

International Search Report and Written Opinion of the International Searching Authority dated Jul. 12, 2016, from related PCT application PCT/US2016/014287, 14 pages.

International Search Report and Written Opinion of the International Searching Authority dated Jul. 16, 2015, from related PCT application PCT/US2015/24723, 8 pages.

International Search Report and Written Opinion of the International Searching Authority dated Jun. 10, 2016 from related PCT application PCT/US2016/014290, 11 pages.

International Search Report and Written Opinion of the International Searching Authority dated Jun. 2, 2016, from related PCT application PCT/US2016/014386, 14 pages.

International Search Report and Written Opinion of the International Searching Authority dated Jun. 2, 2016, from related PCT application PCT/US2016/014387, 13 pages.

International Search Report and Written Opinion of the International Searching Authority dated Jun. 6, 2016, from related PCT application PCT/US2016/014291, 13 pages.

(56) References Cited

OTHER PUBLICATIONS

International Search Report and Written Opinion of the International Searching Authority dated Jun. 9, 2016 from related PCT application PCT/US2016/014333, 16 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016, from related PCT application PCT/US2016/014363, 8 pages.
International Search Report and Written Opinion of the International Searching Authority dated Mar. 25, 2016 from related PCT application PCT/US2016/014389, 19 pages.
International Search Report and Written Opinion of the International Searching Authority dated Mar. 28, 2016, from related PCT application PCT/US2016/014380, 9 pages.
International Search Report and Written Opinion of the International Searching Authority dated Mar. 28, 2016, from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016, from related PCT application PCT/US2016/014330, 8 pages.
International Search Report and Written Opinion of the International Searching Authority dated Mar. 29, 2016, from related PCT application PCT/US2016/014328, 7 pages.
International Search Report and Written Opinion of the International Searching Authority dated Mar. 29, 2016, from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated May 26, 2016, 2016 from related PCT application PCT/US2016/014331, 15 pages.
Le Sage et al., "Efficient photon detection from color centers in a diamond optical waveguide," Phys. Rev. B 85: 121202(R), pp. 121202-1-121202-4, (Mar. 23, 2012).
MacQuarie et al., "Mechanical spin control of nitrogen-vacancy centers in diamond," Retrieved from http://www.arxiv.org/pdf/1306.6356.pdf, pp. 1-8, (Jun. 2013).
Nobauer et al., "Smooth optimal quantum control for robust solid state spin magnetometry," Retrieved from http://www.arxiv.org/abs/1412.5051, pp. 1-12, (Dec. 2014).
Polatomic. "AN/ASQ-233A Digital Magnetic Anomaly Detecting Set." Retrieved May 9, 2016, from http://polatomic.com/images/DMAD_Data_Sheet_09-2009.pdf (2009), 1 page.
Shao et al., "Diamond Color Center Based FM Microwave Demodulator," in Conference on Lasers and Electro-Optics, OSA Technical Digest (online) (Optical Society of America), paper JTh2A.136, 2 pages. (Jun. 5-10, 2016).
US Notice of Allowance dated Apr. 20, 2016, from related U.S. Appl. No. 15/003,718, 9 pages.
US Notice of Allowance dated Mar. 29, 2016, from related U.S. Appl. No. 15/003,590, 11 pages.
US Office Action dated Jul. 29, 2016 from related U.S. Appl. No. 14/680,877, 8 pages.
US Office Action dated May 13, 2016, from related U.S. Appl. No. 14/676,740, 15 pages.
US Office Action dated May 6, 2016, from related U.S. Appl. No. 14/659,498, 20 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013).
Acosta, "Optical Magnetometry with Nitrogen-Vacancy Centers in Diamond," University of California Berkeley, 2011.
Acosta, et al., "Diamonds with a high density of nitrogen—vacancy centers for magnetometry applications," Physical Review B, Sep. 2009.
Acosta, et al., "Nitrogen-vacancy centers: physics and applications," MRS Bulletin, 2013.
Aiello, et al., "Composite-pulse magnetometry with a solid-state quantum sensor," Nature Communications, Jan. 2013.
Alam, "Solid-state C-13 magic angle spinning NMR spectoscopy characterization of particle size structural variations in synthetic nanodiamonds," Materials Chemistry and Physics, Jun. 2004.
Albrecht, et al., "Coupling of nitrogen vacancy centres in nanodiamonds by means of phonons," New Journal of Physics, Aug. 2013.
Anthony, et al., "Jahn-Teller Splitting and Zeeman Effect of Acceptors in Diamond," 20th International Conference on Defects in Semiconductors, Jul. 1999.
Appel, et al., "Nanoscale microwave imaging with a single electron spin in diamond," New Journal of Physics, Nov. 2015.
Arai, et al., "Fourier magnetic imaging with nanoscale resolution and compressed sensing speed-up using electronic spins in diamond," Nature Nanotechnology, Oct. 2015.
Aslam, et al., "Single spin optically detected magnetic resonance with 60-90 GHz (E-band) microwave resonators," Review of Scientific Instruments, Jun. 2015.
Awschalom, et al., "Diamond age of spintronics," Scientific American, Oct. 2007.
Babamoradi, et al., "Correlation between entanglement and spin density in nitrogen-vacancy center of diamond," European Physical Journal D, Dec. 2011.
Babunts, et al., "Diagnostics of NV defect structure orientation in diamond using optically detected magnetic resonance with a modulated magnetic field," Technical Physics Letters, Jun. 2015.
Babunts, et al., "Temperature-scanned magnetic resonance and the evidence of two-way transfer of a nitrogen nuclear spin hyperfine interaction in coupled NV-N pairs in diamond," JETP Letters, Jun. 2012.
Bagguley, et al., "Zeeman effect of acceptorstates in semiconducting diamond," Journal of the Physical Society of Japan, 1966.
Balasubramanian, et al., "Nanoscale imaging magnetometry with diamond spins under ambient conditions," Nature, Oct. 2008.
Balmer, et al., "Chemical Vapour deposition synthetic diamond: materials technology and applications," J. of Physics, 2009.
Baranov, et al., "Enormously High Concentrations of Fluorescent Nitrogen-Vacancy Centers Fabricated by Sintering of Detonation Nanodiamonds," Small, Jun. 2011.
Barfuss, et al., "Strong mechanical driving of a single electron spin," Nature Physics, Oct. 2015.
Bennett, et al., "CVD Diamond for High Power Laser Applications," Proceedinas of SPIE, Jan. 2013.
Berman & Chernobrod, "Single-spin microscope with sub-nanoscale resolution based on optically detected magnetic resonance," Proceedings of SPIE, May 2010.
Blakley, et al., "Room-temperature magnetic gradiornetry with fiber-coupled nitrogen-vacancy centers in diamond," Optics Letters, Aug. 2015.
Bourgeois, et al., "Photoelectric detection of electron spin resonance of nitrogen-vacancy centres in diamond," Nature Communications, Oct. 2015.
Budker & Kimball, "Optical Magnetometry," Cambridge Press, 2013.

(56) References Cited

OTHER PUBLICATIONS

Budker & Romalis, "Optical Magnetometry," Nature Physics, 2007.
Casanova, et al., "Effect of magnetic field on phosphorus centre in diamond," Physica Status Solidi A, Jul. 2001.
Castelletto, et al., "Frontiers in diffraction unlimited optical methods for spin manipulation, magnetic field sensing and imaging using diamond nitrogen vacancy defects," Nanophotonics, 2012.
Chapman, et al., "Anomalous saturation effects due to optical spin depolarization in nitrogen-vacancy centers in diamond nanocrystals," Physical Review B, Jul. 2012.
Chen, et al., "Vector magnetic field sensing by a single nitrogen vacancy center in diamond," EPL, Mar. 2013.
Chernobrod, et al., "Improving the sensitivity of frequency modulation spectroscopy using nanomechanical cantilevers," Applied Physics Letters, 2004.
Chernobrod, et al., "Spin Microscope Based on Optically Detected Magnetic Resonance," Journal of Applied Physics, 2005.
Childress, et al., "Coherent dynamics of coupled electron and nuclear spin qubits in diamond," Science, 2006.
Chipaux, et al., "Magnetic imaging with an ensemble of nitrogen vacancy-centers in diamond," European Physical Journal D, Jul. 2015.
Chipaux, et al., "Nitrogen vacancies (NV) centers in diamond for magnetic sensors and quantum sensing," Proceedings of SPIE, Jan. 2015.
Chipaux, et al., "Wide bandwidth instantaneous radio frequency spectrum analyzer based on nitrogen vacancy centers in diamond," Applied Physics Letters, Dec. 2015.
Clevenson, et al., "Broadband magnetometry and temperature sensing with a light-trapping diamond waveguide," Nature Physics, May 2015.
Cooper, et al., "Time-resolved magnetic sensing with electronic spins in diamond," Nature Communications, Jan. 2014.
Creedon, et al., "Strong coupling between P1 diamond impurity centers and a three-dimensional lumped photonic microwave cavity," Physical Review B, Apr. 2015.
Davies, "Current problems in diamond: towards a quantitative understanding," Physica B—Condensed Matter, Dec. 1999.
De Lange, et al., "Single-Spin Magnetometry with Multipulse Sensing Sequences," Physical Review Letters, Feb. 2011.
Degen; "Scanning magnetic field microscope with a diamond single-spin sensor ," Applied Physics Letters, 2008.
Delacroix, et al., "Design, manufacturing, and performance analysis of mid-infrared achromatic half-wave plates with diamond subwavelength gratings," Applied Optics, 2012.
Denatale, et al., "Fabrication and characterization of diamond moth eye antireflective surfaces on Ge," J. of Applied Physics, 1982.
Dobrovitski, et al., "Quantum Control over Single Spins in Diamond," Annual Review of Condensed Matter Physics vol. 4, 2013.
Doherty, et al., "The nitrogen-vacancy colour centre in diamond," Physics Reports, Jul. 2013.
Doherty, et al., "Theory of the ground-state spin of the NV—center in diamond," Physical Review B, May 2012.
Doi, et al., "Pure negatively charged state of the NV center in n-type diamond," Physical Review B, Feb. 2016.
Drake, et al., "Influence of magnetic field alignment and defect concentration on nitrogen-vacancy polarization in diamond," New Journal of Physics, Jan. 2016.
Dreau, et al., "Avoiding power broadening in optically detected magnetic resonance of single NV defects for enhanced dc magnetic field sensitivity," Physical Review B. Nov. 2011.
Dreau, et al., "High-resolution spectroscopy of single NV defects coupled with nearby C-13 nuclear spins in diamond," Physical Review B, Apr. 2012.
Dumeige, et al., "Magnetometry with nitrogen-vacancy ensembles in diamond based on infrared absorption in a doubly resonant optical cavity," Physical Review B, Apr. 2013.
Epstein, et al., "Anisotropic interactions of a single spin and dark-spin spectroscopy in diamond," Center for Spintronics and Quantum Computation, 2005.
Fedotov, et al., "High-resolution magnetic field imaging with a nitrogen-vacancy diamond sensor integrated with a photonic-crystal fiber," Optics Letters, Feb. 2016.
Fedotov, et al., "Photonic-crystal-fiber-coupled photoluminescence interrogation of nitrogen vacancies in diamond nanoparticles," Laser Physics Letters, Feb. 2012.
Feng & Wei, "A steady-state spectral method to fit microwave absorptions of NV centers in diamonds: application to sensitive magnetic field sensing," Measurement Science & Technology, Oct. 2014.
Freitas, et al., "Solid-State Nuclear Magnetic Resonance (NMR) Methods Applied to the Study of Carbon Materials," Chemistry and Physics of Carbon, vol. 31, 2012.
Geiselmann, et al., "Fast optical modulation of the fluorescence from a single nitrogen-vacancy centre," Nature Physics, Dec. 2013.
Gombert & Blasi, "The Moth-Eye Effect-From Fundamentals to Commercial Exploitation," Functional Properties of Bio-Inspired Surfaces, Nov. 2009.
Gong, et al., "Generation of Nitrogen-Vacancy Center Pairs in Bulk Diamond by Molecular Nitrogen Implantation," Chinese Physics Letters, Feb. 2016.
Gould, et al., "An imaging magnetometer for bio-sensing based on nitrogen-vacancy centers in diamond," Proceedings of the SPIE—Progress in Biomedical Optics and Imaging, 2014.
Gould, et al., "Room-temperature detection of a single 19 nm super-paramagnetic nanoparticle with an imaging magnetometer," Applied Physics Letters, Aug. 2014.
Gruber, et al., "Scanning confocal optical microscopy and magnetic resonance on single defect centers," Science, Jun. 1997.
Haeberle, et al., "Nanoscale nuclear magnetic imaging with chemical contrast," Nature Nanotechnology, Feb. 2015.
Haihua, et al., "Design of wideband anti-reflective sub wavelength nanostructures," Infrared and Laser Engineering, 2011.
Hall, et al., "Sensing of Fluctuating Nanoscale Magnetic Fields Using Nitrogen-Vacancy Centers in Diamond," Physical Review Letters, Nov. 2009.
Hanson, et al., "Coherent Dynamics of a single spin interacting with an adjustable spin bath," Sci. Am. Ass'n for the Advancement of Science, 2008.
Hanson, et al., "Polarization and Readout of Coupled Single Spins in Diamond," Physical Review Letters, 2006.
Hanson, et al., "Room-temperature manipulation and decoherence of a single spin in diamond," Physical Review, 2006.
Hanzawa, et al., "Zeeman effect on the zero-phonon line of the NV center in synthetic diamond," Physica B, Feb. 1993.
Hegyi & Yablonovitch, "Molecular imaging by optically detected electron spin resonance of nitrogen-vacancies in nanodiamonds," Nano Letters, Mar. 2013.
Hegyi & Yablonovitch, "Nanodiamond molecular imaging with enhanced contrast and expanded field of view," Journal of Biomedical Optics, Jan. 2014.
Hilser, et al., "All-optical control of the spin state in the NV-center in diamond," Physical Review B, Sep. 2012.
Hobbs, "Study of the Environmental and Optical Durability of AR Microstructures in apphire, ALON, and Diamond," Proceedings of SPIE, 2009.
Huebener, et al., "ODMR of NV centers in nano-diamonds covered with N@C60," Physica Status Solidi B, Oct. 2008.
Huxter, et al., "Vibrational and electronic dynamics of nitrogen-vacancy centres in diamond revealed by two-dimensional ultrafast spectroscopy," Nature Physics, Nov. 2013.
Ivady, et al., "Pressure and temperature dependence of the zero-field splitting in the ground state of NV centers in diamond: A first-principles study," Physical Review B, Dec. 2014.
Jarmola, et al., "Temperature- and Magnetic-Field-Dependent Longitudinal Spin Relaxation in Nitrogen-Vacancy Ensembles in Diamond," Physical Review Letters, May 2012.
Jensen, et al., "Light narrowing of magnetic resonances in ensembles of nitrogen—vacancy centers in diamond," Physical Review, Jan. 2013.
Kailath, "Linear Systems," Prentice Hail, 1979.

(56) References Cited

OTHER PUBLICATIONS

Karlsson, et al., "Diamond micro-optics: microlenses and antireflection structures surfaces for the infrared spectral region," Optics Express, 2003.
Khan & Hemmer, "Noise limitation in nano-scale imaging," Proceedings of SPIE, Dec. 2005.
Kim, et al., "Electron spin resonance shift and linewidth broadening of nitrogen-vacancy centers in diamond as a function of electron irradiation dose," Applied Physics Letters, Aug. 2012.
Kim, et al., "Magnetospectroscopy of acceptors in 'blue' diamonds," Physica B, Aug. 2001.
Kim, et al., "Zeeman effect of electronic Raman lines of accepters in elemental semiconductors: Boron in blue diamond," Physical Review B, Sep. 2000.
King, et al., "Optical polarization of 13C nuclei in diamond through nitrogen vacancy centers," Physical Review B, Feb. 2010.
Kok, et al., "Materials Science: Qubits in the pink," Nature, 2006.
Konenko, et al., "Formation of antireflective surface structures on diamond films by laser patterning," Applied Physics A, 1999.
Kraus, et al., "Magnetic field and temperature sensing with atomic-scale spin defects in silicon carbide," Scientific Reports, Jul. 2014.
Lai, et al., "Influence of a static magnetic field on the photoluminescence of an ensemble of nitrogen-vacancy color centers in a diamond single-crystal," Applied Physics Letters, Sep. 2009.
Lai, et al., "Optically detected magnetic resonance of a single Nitrogen-Vacancy electronic spin in diamond nanocrystals," CLEO/EQEC, 2009.
Laraoui, et al., "Nitrogen-vacancy-assisted magnetometry of paramagnetic centers in an individual diamond nanocrystal," Nano Letters, Jul. 2012.
Lazariev, et al., "A nitrogen-vacancy spin based molecular structure microscope using multiplexed projection reconstruction," Scientific Reports, Sep. 2015.
Lee, et al., "Vector magnetometry based on S=3/2 electronic spins," Physical Review B, Sep. 2015.
Lesik, et al., "Preferential orientation of NV defects in CVD diamond films grown on (113)-oriented substrates," Diamond and Related Materials, Jun. 2015.
Levchenko, et al., "Inhomogeneous broadening of optically detected magnetic resonance of the ensembles of nitrogen-vacancy centers in diamond by interstitial carbon atoms," Applied Physics Letters, Mar. 2015.
Liu, et al., "Electron spin studies of nitrogen vacancy centers in nanodiamonds," Acta Physica Sinica, Aug. 2013.
Liu, et al., "Fiber-integrated diamond-based magnetometer," Applied Physics Letters, Sep. 2013.
MacLaurin, et al., "Nanoscale magnetometry through quantum control of nitro n-vacancy centres in rotationally diffusing nanodiamond," New Journal of Physics, Jan. 2013.
Macs, et al., "Diamond as a magnetic field calibration probe," Journal of Physics D: Applied Physics, Apr. 2004.
Maletinsky, et al., "A robust scanning diamond sensor for nanoscale imaging with single nitrogen-vacancy centres," Nature Nanotechnology, May 2012.
Mamin, et al., "Multipulse Double-Quantum Magnetornetry with Near-Surface Nitrogen-Vacancy Centers," Physical Review Letters, Jul. 2014.
Mamin, et al., "Nanoscale Nuclear Magnetic Resonance with a Nitrogen-Vacancy Spin Sensor," Science, Feb. 2013.
Manson, et al., "GR transitions in diamond: magnetic field measurements," Journal of Physics C, Nov. 1980.
Matsuda, et al., "Development of a plastic diamond anvil cell for high pressure magneto-photoluminescence in pulsed high magnetic fields," International Journal of Modern Physics B, Nov. 2004.
Maze, et al., "Nanoscale magnetic sensing using spin qubits in diamond," Nature Physics, 2009.
Meijer, et al., "Generation of single color centers by focused nitrogen implantation," Applied Physics Letters, Dec. 2005.

Millot, et al., "High-field Zeeman and paschen-back effects at high pressure in oriented ruby," Physical Review B, Oct. 2008.
Moriyama, et al., "Importance of electron-electron interactions and Zeeman splitting in single-wall carbon nanotube quantum dots," Physica E, Feb. 2005.
Mrozek, et al,, "Circularly polarized microwaves for magnetic resonance study in the GHz range: Application to nitrogen-vacancy in diamonds," Applied Physics Letters, Jul. 2015.
Nagl, et al., "Improving surface and defect center chemistry of fluorescent nanodiamonds for imaging purposes—a review," Analytical and Bioarialaytical Chemistry, Oct. 2015.
Neumann, et al., "Excited-state spectroscopy of single NV defects in diamond using optically detected magnetic resonance," New Journal of Physics, Jan. 2009.
Nizovtsev & Kilin, "Optically Detected Magnetic Resonance Spectra of the 14NV-13C Spin Systems in Diamond: Analytical Theory and Experiment," Doklady of the National Academy of Sciences of Belarus, 2013.
Nizovtsev, et al., "Modeling fluorescence of single nitrogen-vacancy defect centers in diamond," Physica B—Condensed Matter, Dec. 2001.
Nizovtsev, et al., "Theoretical study of hyperfine interactions and optically detected magnetic resonance spectra by simulation of the C-291(NV)H—(172) diamond cluster hosting nitrogen-vacancy center," New Journal of Physics, Aug. 2014.
Nowodzinski, et al., "Nitrogen-Vacancy centers in diamond for current imaging at the redistributive layer level of Integrated Circuits," Microelectronics Reliability, Aug. 2015.
Nusran, et al., "Optimizing phase-estimation algorithms for diamond spin magnetometry," Physical Review B, Jul. 2014.
Ohashi, et al., "Negatively Charged Nitrogen-Vacancy Centers in a 5 nm Thin C-12 Diamond Film," Nano Letters, Oct. 2013.
Plakhotnik, et al., "Super-Paramagnetic Particles Chemically Bound to Luminescent Diamond : Single Nanocrystals Probed with Optically Detected Magnetic Resonance," Journal of Physical Chemistry C, Aug. 2015.
Rabeau, et al., "Implantation of labelled single nitrogen vacancy centers in diamond using N-15," Applied Physics Letters, Jan. 2006.
Ranjbar, et al., "Many-electron states of nitrogen-vacancy centers in diamond and spin density calculations," Physical Review B, Oct. 2011.
Reynhardt, "Spin-lattice relaxation of spin-1/2 nuclei in solids containing diluted paramagnetic impurity centers. I. Zeeman polarization of nuclear spin system," Concepts in Magnetic Resonance Part A, Sep. 2003.
Rogers, et al., "Singlet levels of the NV(−)centre in diamond," New Journal of Physics, Jan. 2015.
Rondin, et al., "Magnetometry with nitrogen-vacancy defects in diamond," Reports on Progress in Physics, May 2014.
Rondin, et al., "Nanoscale magnetic field mapping with a single spin scanning probe magnetometer," Applied Physics Letters, Apr. 2012.
Sarkar, et al., "Magnetic properties of graphite oxide and reduced graphene oxide," Physica E, 2014.
Scheuer, et al., "Accelerated 2D magnetic resonance spectroscopy of single spins using matrix completion," Scientific Reports, Dec. 2015.
Schirhagl, et al., "Nitrogen-vacancy centers in diamond: Nanoscale sensors for physics and biology," Annual Review of Physical Chemistry, Jan. 2014.
Schoenfeld & Harneit, "Real time magnetic field sensing and imaging using a single spin in diamond," Physical Review Letters, Jan. 2011.
Sedov, et al., "Si-doped nano- and microcrystalline diamond films with controlled bright photoluminescence of silicon-vacancy color centers," Diamond and Related Materials, Jun. 2015.
Shames, et al., "Magnetic resonance tracking of fluorescent nanodiamond fabrication," Journal of Physics D: Applied Physics, Apr. 2015.
Simanovskaia, et al., "Sidebands in optically detected magnetic resonance signals of nitrogen vacancy centers in diamond," Physical Review B, Jun. 2013.

(56) References Cited

OTHER PUBLICATIONS

Sotoma, et al., "Effective production of fluorescent nanodiamonds containing negatively-charged nitrogen-vacancy centers by ion irradiation," Diamond and Related Materials, Oct. 2014.
Steiner, et al., "Universal enhancement of the optical readout fidelity of single electron spins at nitrogen-vacancy centers in diamond," Physical Review B, Jan. 2010.
Stenert, et al., "High sensitivity magnetic imaging using an array of spins in diamond," Review of Scientific Instruments, Apr. 2010.
Stepanov, et al., "High-frequency and high-field optically detected magnetic resonance of nitrogen-vacancy centers in diamond," Applied Physics Letters, Feb. 2015.
Sternschulte, et al., "Uniaxial stress and Zeeman splitting of the 1.681 eV optical center in a homoepitaxial CVD diamond film," Diamond and Related Materials, Sep. 1995.
Storteboom, et al., "Lifetime investigation of single nitrogen vacancy centres in nanodiamonds," Optics Express, May 2015.
Tahara, et al., "Quantifying selective alignment of ensemble nitrogen-vacancy centers in (111) diamond," Applied Physics Letters, Nov. 2015.
Taylor, et al., "High-sensitivity diamond magnetometer with nanoscale resolution," Nature Physics, Oct. 2008.
Terblanche, et al., "13C spin-lattice relaxation in natural diamond: Zeeman relaxation at 4.7 T and 300 K due to fixed paramagnetic nitrogen defects," Solid State Nuclear Magnetic Resonance, Aug. 2001.
Terblanche, et al., "13C spin-lattice relaxation in natural diamond: Zeeman relaxation in fields of 500 to 5000 G at 300 K due to fixed paramagnetic nitrogen defects," Solid State Nuclear Magnetic Resonance, May 2001.
Tetienne, et al., "Magnetic-field-dependent photodynamics of single NV defects in diamond: an application to qualitative all-optical magnetic imaging," New Journal of Physics, Oct. 2012.
Tong, et al., "A hybrid-system approach for W state and cluster state generation," Optics Communication 310: 166-172 (2014).
Uhlen, et al., "New Diamond Nanofabrication process for hard x-ray zone plates," J. of Vacuum Science & Tech. B, 2011.
Vershovskii & Dmitriev, "Combined excitation of an optically detected magnetic resonance in nitrogen-vacancy centers in diamond for precision measurement of the components of a magnetic field vector," Technical Physics Letters, Nov. 2015.
Vershovskii & Dmitriev, "Micro-scale three-component quantum magnetometer based on nitrogen-vacancy color centers in diamond crystal," Technical Physics Letters, Apr. 2015.
Wang, et al., "Optimizing ultrasensitive single electron magnetometer based on nitrogen-vacancy center in diamond," Chinese Science Bulletin, Aug. 2013.
Webber, et al., "Ab initio thermodynamics calculation of the relative concentration of NV- and NV0 defects in diamond," Physical Review B, Jan. 2012.
Wolf, et al., "Subpicotesla Diamond Magnetornety," Physical Review X, Oct. 2015.
Wolfe, et al., "Off-resonant manipulation of spins in diamond via precessing magnetization of a proximal ferromagnet," Physical Review B, May 2014.
Xue & Liu, "Producing GHZ state of nitrogen-vacancy centers in cavity QED," Journal of Modern Optics, Mar. 2013.
Yang & Gu, "Novel calibration techniques for high pulsed-magnetic fields using luminescence caused by photo," Journal of Huazhong University of Science and Technology, Jun. 2007.
Yavkin, et al., "Defects in Nanodiamonds: Application of High-Frequency cw and Pulse EPR, ODMR," Applied Magnetic Resonance, Oct. 2014.
Yu, et al., "Bright fluorescent nanodiamonds: no photobleaching and low cytotoxicity," J, Am. Chem, Soc., 2005.
Zhang, et al., "Laser-polarization-dependent and magnetically controlled optical bistability in diamond nitrogen-vacancy centers," Physics Letters A, Nov. 2013.
Zhang, et al., "Laser-polarization-dependent spontaneous emission of the zero phonon line from single nitrogen-vacancy center in diamond," Chinese Physics B, Apr. 2014.
Zhang, et al., "Scalable quantum information transfer between nitrogen-vacancy-center ensembles," Annals of Physics, Apr. 2015.
Zhao, et al., "Atomic-scale magnetometry of distant nuclear spin clusters via nitrogen-vacancy spin in diamond," Nature Nanotechnology, Apr. 2011.
Berman, et al. "Measurement of single electron and nuclear spin states based on optically detected magnetic resonance," J. Physics: Conf. Series 38: 167-170 (2006).
International Search Report and Written Opinion of the International Searching Authority dated Apr. 11, 2016, in international patent application PCT/US2016/014388.
Poole, "Wnat is GMSK Modulation—Gaussian Minimum Shift Keying." Radio-Electronics. Apr. 3, 2015 (Apr. 2015), pp. 1 [online] https://web.archive.org/web/20150403045840/http://www.radio-electronics.com/info/rf-technology-design/pm-phase-modulation/what-is-gmsk-gaussian-minimum-shift-keying-tutorial.php.
Rondin et al., "Magnetometry with nitrogen-vacancy defects in diamond." May 22, 2014 (May 22, 2014), pp. 1 [online] http://arxiv.org/pdf/1311.5214.pdf.
"'Diamond Sensors, Detectors, and Quantum Devices' in Patent Application Approval Process," Chemicals & Chemistry (Feb. 28, 2014).
"Findings from University of Stuttgart in physics reported," Physics Week (Jul. 7, 2009).
"New Findings on Nitrogen from Ecole Normale Superieure Summarized (Magnetic imaging with an ensemble of nitrogen vacancy-centers in diamond)," Physics Week (Jul. 21, 2015).
"Patent Issued for Diamond Sensors, Detectors, and Quantum Devices (U.S. Pat. No. 9,249,526)," Journal of Engineering (Feb. 15, 2016).
"Researchers Submit Patent Application, 'Diamond Sensors, Detectors, and Quantum Devices', for Approval," Chemicals & Chemistry (Apr. 11, 2014).
Massachusetts Institute of Technology; "Wide-Field Imaging Using Nitrogen Vacancies" in Patent Application Approval Process, Physics Week (2015).
Maze et al., "Nanoscale magnetic sensing with an individual electronic spin in diamond," Nature Physics (2008).
Steinert et al., "High-sensitivity magnetic imaging using an array of spins in diamond," Rev. Sci. Inst. (2010).
Correction: Nizovtsev & Kilin, "Optically Detected Magnetic Resonance Spectra of the 14NV-13C Spin Systems in Diamond: Analytical Theory and Experiment," Doklady of the National Academy of Sciences of Belarus, 2013.
Correction: Terblanche, et al., "13C spin-lattice relaxation in natural diamond: Zeeman relaxation at 4.7 T and 300 K due to fixed paramagnetic nitrogen defects," Solid State Nuclear Magnetic Resonance, Aug. 2001.
Correction: Tong, et al., "A hybrid-system approach for W state and cluster state generation," Optics Communication 310: 166-172 (2014).
Correction: Yang & Gu, "Novel calibration techniques for high pulsed-magnetic fields using luminescence caused by photo," Journal of Huazhong University of Science and Technology, Jun. 2007.
Correction: Zhang, et al., "Laser-polarization-dependent spontaneous emission of the zero phonon line from single nitrogen-vacancy center in diamond," Chinese Physics B, Apr. 2014.
Fallah et al., "Multi-sensor approach in vessel magnetic wake imaging," Wave Motion 51(1): 60-76 (Jan. 2014), retrieved from http://www.sciencedirect.com/science/article/pii/S0165212513001133 (Aug. 21, 2016), 17 pages.
International Preliminary Report on Patentability dated Oct. 20, 2016 from related PCT application PCT/US2015/024723, 7 pages.
International Search Report and Written Opinion of the International Searching Authority dated Sep. 13, 2016 from related PCT application PCT/US16/14377, 11 pages.
Notice of Allowance dated Aug. 17, 2016, from related U.S. Appl. No. 15/003,718, 8 pages.
Notice of Allowance dated Sep. 8, 2016, from related U.S. Appl. No. 15/003,298, 10 pages.

(56) References Cited

OTHER PUBLICATIONS

Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
US Office Action dated Aug. 24, 2016 from related U.S. Appl. No. 14/676,740, 19 pages.
US Office Action dated Oct. 19, 2016 from U.S. Appl. No. 15/218,821, 6 pages.
US Office Action dated Nov. 2, 2016 from related U.S. Appl. No. 15/003,256, 19 pages.
US Office Action dated Nov. 3, 2016 from related U.S. Appl. No. 15/204,675, 9 pages.
Widmann et al., "Coherent control of single spins in silicon carbide at room temperature," Nature Materials, 14: 164-168 (Feb. 2015) (available online Dec. 1, 2014), 5 pages.
Notice of Allowance dated Dec. 13, 2016, from related U.S. Appl. No. 14/680,877.
Notice of Allowance dated Dec. 22, 2016, from related U.S. Appl. No. 14/659,498.
US Office Action dated Feb. 10, 2017, from related U.S. Appl. No. 14/676,740.
US Office Action dated Feb. 10, 2017, from related U.S. Appl. No. 15/003,088.
US Office Action dated Feb. 16, 2017, from related U.S. Appl. No. 15/204,675.

\* cited by examiner

COMMUNICATION VIA A MAGNIO

CROSS-REFERENCE TO RELATED APPLICATIONS

The present application claims priority to U.S. Application No. 62/261,643, filed Dec. 1, 2015, titled "DIAMOND NITROGEN VACANCY PACKET MAGNETIC RADIO," which is incorporated by reference herein in its entirety.

TECHNICAL FIELD

The present disclosure relates, in general, to magnetic communication. More particularly, the present disclosure relates to a diamond nitrogen vacancy magnio.

BACKGROUND

The following description is provided to assist the understanding of the reader. None of the information provided or references cited is admitted to be prior art. Information can be transmitted over the air using radio waves. For example, information can be coded into bits of 1s and 0s. A radio wave can be modulated in a manner that represents the series of 1s and 0s. A transmitter can receive the radio waves and decode the 1s and 0s to replicate the information. However, communication using radio waves is not perfect. Thus, communicating via alternative methods can be beneficial.

SUMMARY

An illustrative system includes a transmitting device and a receiving device. The transmitting device may include a first processor configured to transmit data to a transmitter and the transmitter. The transmitter may be configured to transmit the data via a magnetic field. The receiving device may include a magnetometer configured to detect the magnetic field and a second processor configured to decipher the data from the detected magnetic field.

An illustrative method includes receiving, at a first processor, data and transmitting, by the transmitter, the data via a magnetic field. The method may also include detecting, by a magnetometer, the magnetic field. The method may further include receiving, by a second processor, an indication of the magnetic field from the magnetometer and deciphering, by the second processor, the data form the indication of the magnetic field.

An illustrative device includes a processor and a transmitter. The processor may be configured to receive a stream of data and encode the stream of data into a plurality of streams of data. The transmitter may be configured to receive the plurality of streams of data and transmit the plurality of streams of data simultaneously via a plurality of magnetic fields. Each of the plurality of streams may be transmitted via a corresponding one of the plurality of magnetic fields.

An illustrative device includes a magnetometer configured to simultaneously measure the magnitude of a modulated magnetic field in a plurality of directions. The device may further include a processor operatively coupled to the magnetometer. The processor may be configured to receive, from the magnetometer, a time-varying signal corresponding to the modulated magnetic field and determine a plurality of transmission channels based on the time-varying signal. The processor may be further configured to monitor the plurality of transmission channels to determine data transmitted on each of the plurality of transmission channels.

The foregoing summary is illustrative only and is not intended to be in any way limiting. In addition to the illustrative aspects, embodiments, and features described above, further aspects, embodiments, and features will become apparent by reference to the following drawings and the detailed description.

Figure 1A:
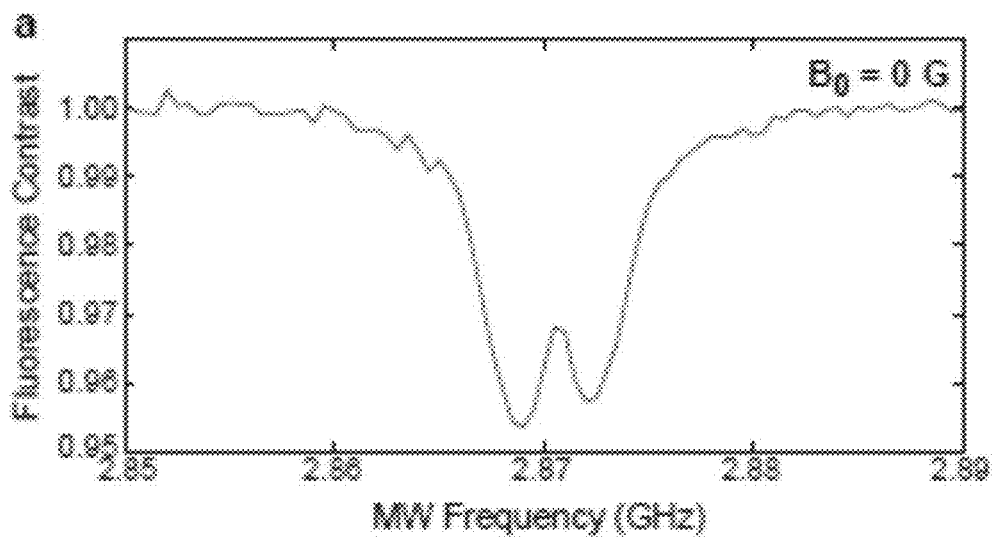
FIGS. 1A and 1B are graphs illustrating the frequency response of a DNV sensor in accordance with an illustrative embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Radio waves can be used as a carrier for information. Thus, a transmitter can modulate radio waves at one location, and a receiver at another location can detect the modulated radio waves and demodulate the signals to receive the information. Many different methods can be used to transmit information via radio waves. However, all such methods use radio waves as a carrier for the information being transmitted.

However, radio waves are not well suited for all communication methods. For example, radio waves can be greatly attenuated by some materials. For example, radio waves do not generally travel well through water. Thus, communication through water can be difficult using radio waves. Similarly, radio waves can be greatly attenuated by the earth. Thus, wireless communication through the earth, for example for coal or other mines, can be difficult. It is often difficult to communicate wirelessly via radio waves from a metal enclosure. The strength of a radio wave signal can also be reduced as the radio wave passes through materials such as walls, trees, or other obstacles. Additionally, communication via radio waves is widely used and understood. Thus, secret communication using radio waves requires complex methods and devices to maintain the secrecy of the information.

According to some embodiments described herein, wireless communication is achieved without using radio waves as a carrier for information. Rather, modulated magnetic fields can be used to transmit information. For example, a transmitter can include a coil or inductor. When current passes through the coil, a magnetic field is generated around the coil. The current that passes through the coil can be modulated, thereby modulating the magnetic field. Accordingly, information converted into a modulated electrical signal (e.g., the modulated current through the coil) can be used to transfer the information into a magnetic field. A magnetometer can be used to monitor the magnetic field. The modulated magnetic field can, therefore, be converted into traditional electrical systems (e.g., using current to transfer information). Thus, a communications signal can be converted into a magnetic field and a remote receiver (e.g., a magnetometer) can be used to retrieve the communication from the modulated magnetic field.

A diamond with a nitrogen vacancy (DNV) can be used to measure a magnetic field. DNV sensors generally have a quick response to magnetic fields, consume little power, and are accurate. Diamonds can be manufactured with nitrogen vacancy (NV) centers in the lattice structure of the diamond. When the NV centers are excited by light, for example green light, and microwave radiation, the NV centers emit light of a different frequency than the excitation light. For example, green light can be used to excite the NV centers, and red light can be emitted from the NV centers. When a magnetic field is applied to the NV centers, the frequency of the light emitted from the NV centers changes. Additionally, when the magnetic field is applied to the NV centers, the frequency of the microwaves at which the NV centers are excited changes. Thus, by shining a green light (or any other suitable color) through a DNV and monitoring the light emitted from the DNV and the frequencies of microwave radiation that excite the NV centers, a magnetic field can be monitored.

NV centers in a diamond are oriented in one of four spin states. Each spin state can be in a positive direction or a negative direction. The NV centers of one spin state do not respond the same to a magnetic field as the NV centers of another spin state. A magnetic field vector has a magnitude and a direction. Depending upon the direction of the magnetic field at the diamond (and the NV centers), some of the NV centers will be excited by the magnetic field more than others based on the spin state of the NV centers.

Figure 1B:
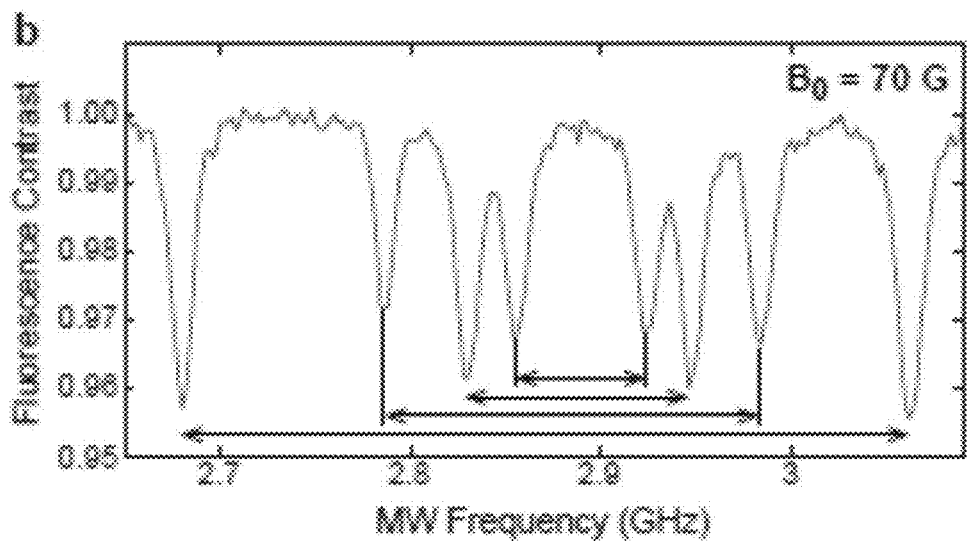

FIGS. 1A and 1B are graphs illustrating the frequency response of a DNV sensor in accordance with an illustrative embodiment. FIGS. 1A and 1B are meant to be illustrative only and not meant to be limiting. FIGS. 1A and 1B plot the frequency of the microwaves applied to a DNV sensor on the x-axis versus the amount of light of a particular frequency (e.g., red) emitted from the diamond. FIG. 1A is the frequency response of the DNV sensor with no magnetic field applied to the diamond, and FIG. 1B is the frequency response of the DNV sensor with a seventy gauss (G) magnetic field applied to the diamond.

As shown in FIG. 1A, when no magnetic field is applied to the DNV sensor, there are two notches in the frequency response. With no magnetic field applied to the DNV sensor, the spin states are not resolvable. That is, with no magnetic field, the NV centers with various spin states are equally excited and emit light of the same frequency. The two notches shown in FIG. 1A are the result of the positive and negative spin directions. The frequency of the two notches is the axial zero field splitting parameter.

When a magnetic field is applied to the DNV sensor, the spin states become resolvable in the frequency response. Depending upon the excitation by the magnetic field of NV centers of a particular spin state, the notches corresponding to the positive and negative directions separate on the frequency response graph. As shown in FIG. 1B, when a magnetic field is applied to the DNV sensor, eight notches appear on the graph. The eight notches are four pairs of corresponding notches. For each pair of notches, one notch corresponds to a positive spin state and one notch corresponds to a negative spin state. Each pair of notches corresponds to one of the four spin states of the NV centers. The amount by which the pairs of notches deviate from the axial zero field splitting parameter is dependent upon how strongly the magnetic field excites the NV centers of the corresponding spin states.

As mentioned above, the magnetic field at a point can be characterized with a magnitude and a direction. By varying the magnitude of the magnetic field, all of the NV centers will be similarly affected. Using the graph of FIG. 1A as an example, the ratio of the distance from 2.87 GHz of one pair to another will remain the same when the magnitude of the magnetic field is altered. As the magnitude is increased, each of the notch pairs will move away from 2.87 GHz at a constant rate, although each pair will move at a different rate than the other pairs.

When the direction of the magnetic field is altered, however, the pairs of notches do not move in a similar manner to one another. FIG. 2A is a diagram of NV center spin states in accordance with an illustrative embodiment. FIG. 2A conceptually illustrates the four spin states of the NV centers. The spin states are labeled NV A, NV B, NV C, and NV D. Vector 201 is a representation of a first magnetic field vector with respect to the spin states, and Vector 202 is a representation of a second magnetic field vector with respect to the spin states. Vector 201 and vector 202 have the same magnitude, but differ in direction. Accordingly, based on the change in direction, the various spin states will be affected differently depending upon the direction of the spin states.

Figure 2B:
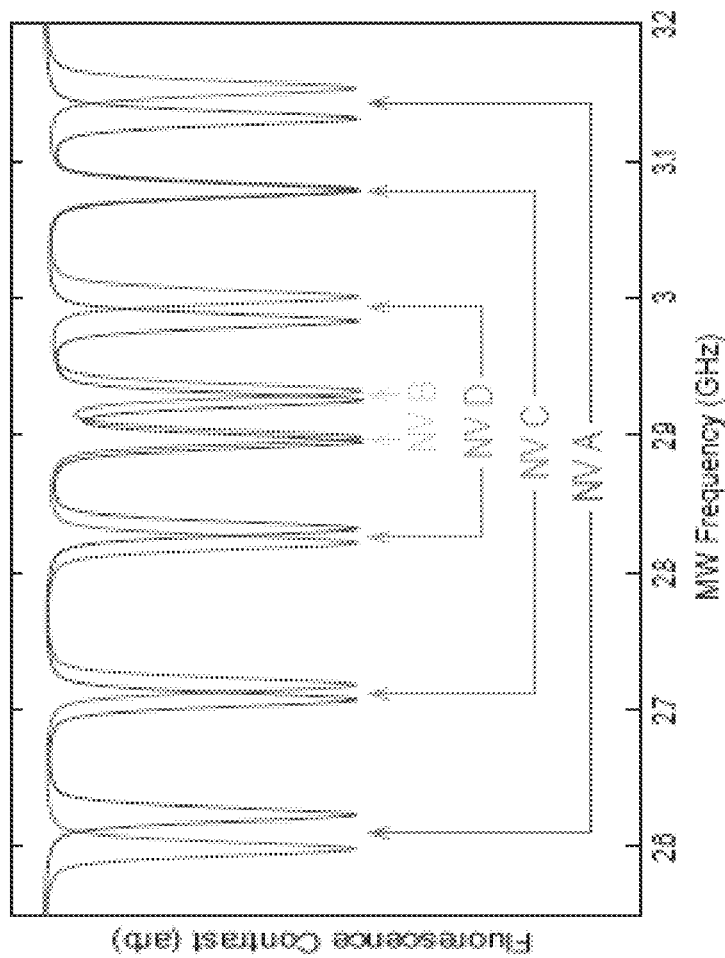
FIG. 2B is a graph illustrating the frequency response of a DNV sensor in response to a changed magnetic field in accordance with an illustrative embodiment.
Figure 2A:
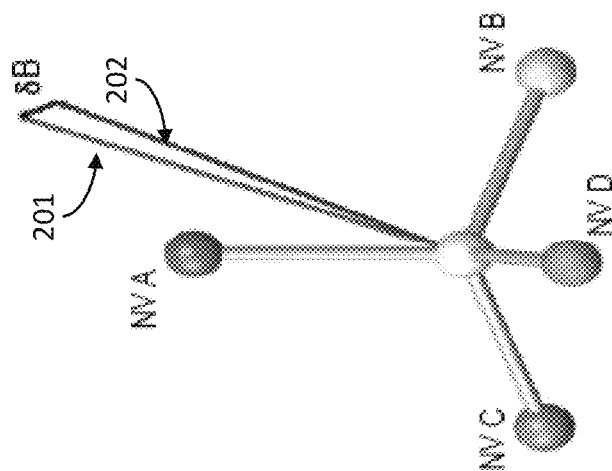
FIG. 2A is a diagram of NV center spin states in accordance with an illustrative embodiment.

FIG. 2B is a graph illustrating the frequency response of a DNV sensor in response to a changed magnetic field in accordance with an illustrative embodiment. The frequency response graph illustrates the frequency response of the DNV sensor from the magnetic field corresponding to vector 201 and to vector 202. As shown in FIG. 2B, the notches corresponding to the NV A and NV D spin states moved closer to the axial zero field splitting parameter from vector 201 to vector 202, the negative (e.g., lower frequency notch) notch of the NV C spin state moved away from the axial zero field splitting parameter, the positive (e.g., high frequency notch) of the NV C spin state stayed essentially the same, and the notches corresponding to the NV B spin state increased in frequency (e.g., moved to the right in the graph). Thus, by monitoring the changes in frequency response of the notches, the DNV sensor can determine the direction of the magnetic field.

Additionally, magnetic fields of different directions can be modulated simultaneously and each of the modulations can be differentiated or identified by the DNV sensor. For example, a magnetic field in the direction of NV A can be modulated with a first pattern, a magnetic field in the direction of NV B can be modulated with a second pattern, a magnetic field in the direction of NV C can be modulated with a third pattern, and a magnetic field in the direction of NV D can be modulated with a fourth pattern. The movement of the notches in the frequency response corresponding to the various spin states can be monitored to determine each of the four patterns.

However, in some embodiments, the direction of the magnetic field corresponding to the various spin states of a DNV sensor of a receiver may not be known by the transmitter. In such embodiments, by monitoring at least three of the spin states, messages transmitted on two magnetic fields that are orthogonal to one another can be deciphered. Similarly, by monitoring the frequency response of the four spin states, messages transmitted on three magnetic fields that are orthogonal to one another can be deciphered. Thus, in some embodiments, two or three independent signals can be transmitted simultaneously to a receiver that receives and deciphers the two or three signals. Such embodiments can be a multiple-input multiple-output (MIMO) system. Diversity in the polarization of the magnetic field channels provides a full rank channel matrix even through traditionally keyhole channels. In an illustrative embodiment, a full rank channel matrix allows MIMO techniques to leverage all degrees of freedom (e.g., three degrees of polarization). Using a magnetic field to transmit information circumvents the keyhole effect that propagating a radio frequency field can have.

Figure 3:
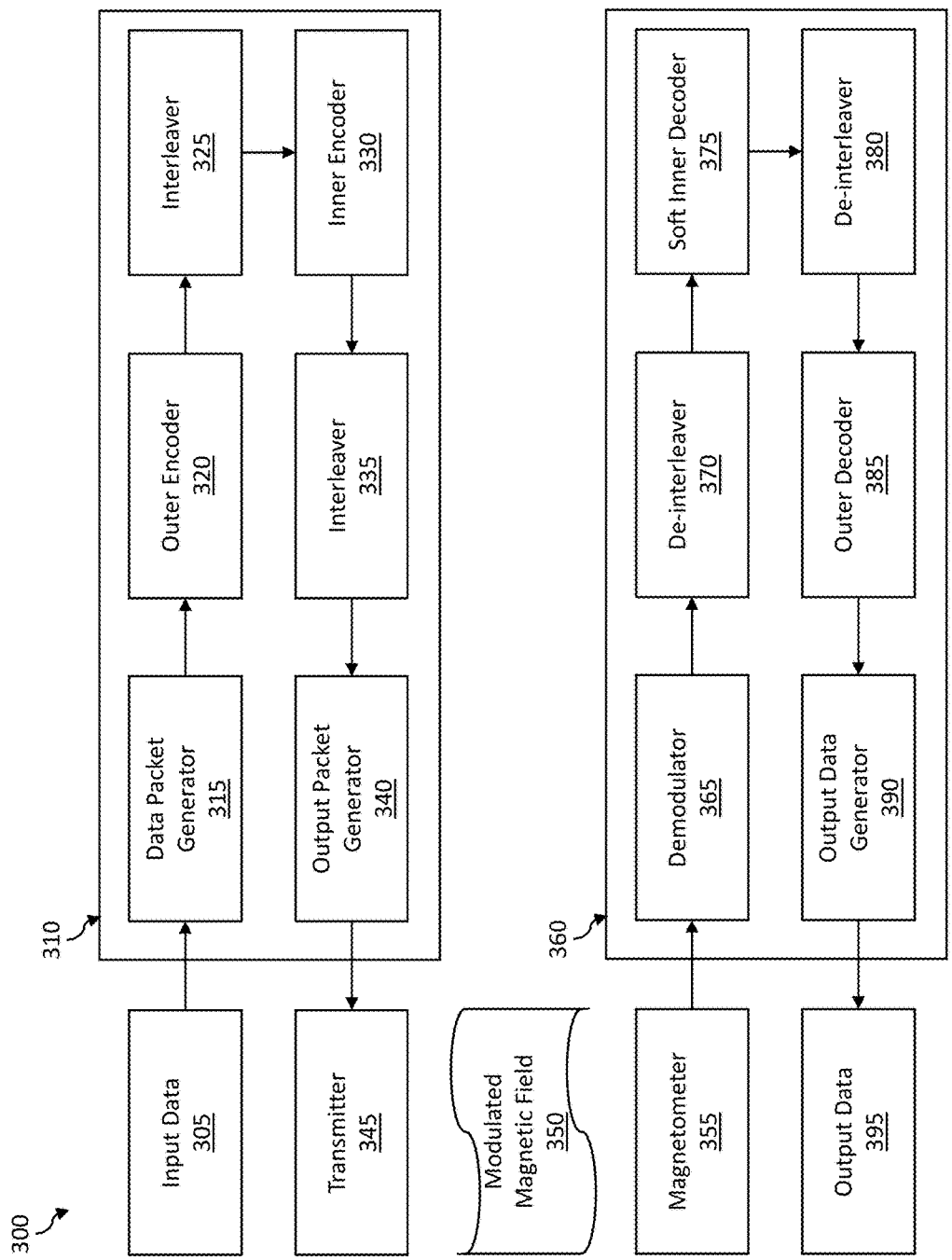
FIG. 3 is a block diagram of a magnetic communication system in accordance with an illustrative embodiment.

FIG. 3 is a block diagram of a magnetic communication system in accordance with an illustrative embodiment. An illustrative magnio system 300 includes input data 305, a 310, a transmitter 345, a modulated magnetic field 350, a magnetometer 355, a magnio receiver 360, and output data 395. In alternative embodiments, additional, fewer, and/or different elements may be used.

In an illustrative embodiment, input data 305 is input into the magnio system 300, transmitted wirelessly, and the output data 395 is generated at a location remote from the generation of the input data 305. In an illustrative embodiment, the input data 305 and the output data 395 contain the same information.

In an illustrative embodiment, input data 305 is sent to the magnio transmitter 310. The magnio transmitter 310 can prepare the information received in the input data 305 for transmission. For example, the magnio transmitter 310 can encode or encrypt the information in the input data 305. The magnio transmitter 310 can send the information to the transmitter 345.

The transmitter 345 is configured to transmit the information received from the magnio transmitter 310 via one or more magnetic fields. The transmitter 345 can be configured to transmit the information on one, two, three, or four magnetic fields. That is, the transmitter 345 can transmit information via a magnetic field oriented in a first direction, transmit information via a magnetic field oriented in a second direction, transmit information via a magnetic field oriented in a third direction, and/or transmit information via a magnetic field oriented in a fourth direction. In some embodiments in which the transmitter 345 transmits information via two or three magnetic fields, the magnetic fields can be orthogonal to one another. In alternative embodiments, the magnetic fields are not orthogonal to one another.

The transmitter 345 can be any suitable device configured to create a modulated magnetic field. For example, the transmitter 345 can include one or more coils. Each coil can be a conductor wound around a central axis. For example, in embodiments in which the information is transmitted via three magnetic fields, the transmitter 345 can include three coils. The central axis of each coil can be orthogonal to the central axis of the other coils.

The transmitter 345 generates the modulated magnetic field 350. The magnetometer 355 can detect the modulated magnetic field 350. The magnetometer 355 can be located remotely from the transmitter 345. For example, with a current of about ten Amperes through a coil (e.g., the transmitter) and with a magnetometer magnetometer 355 with a sensitivity of about one hundred nano-Tesla, a message can be sent, received, and recovered in full with several meters between the transmitter and receiver and with the magnetometer magnetometer 355 inside of a Faraday cage. The magnetometer 355 can be configured to measure the modulated magnetic field 350 along three or four directions. As discussed above, a magnetometer 355 using a DNV sensor can measure the magnetic field along four directions associated with four spin states. The magnetometer 355 can transmit information, such as frequency response information, to the magnio receiver 360.

The magnio receiver 360 can analyze the information received from the magnetometer 355 and decipher the information in the signals. The magnio receiver 360 can reconstitute the information contained in the input data 305 to produce the output data 395.

In an illustrative embodiment, the magnio transmitter 310 includes a data packet generator 315, an outer encoder 320, an interleaver 325, an inner encoder 330, an interleaver 335, and an output packet generator 340. In alternative embodiments, additional, fewer, and/or different elements may be used. The various components of the magnio transmitter 310 are illustrated in FIG. 3 as individual components and are meant to be illustrative only. However, in alternative embodiments, the various components may be combined. Additionally, the use of arrows is not meant to be limiting with respect to the order or flow of operations or information. Any of the components of the magnio transmitter 310 can be implemented using hardware and/or software.

The input data 305 can be sent to the data packet generator 315. In an illustrative embodiment, the input data 305 is a series or stream of bits. The data packet generator 315 can break up the stream of bits into packets of information. The packets can be any suitable size. In an illustrative embodiment, the data packet generator 315 includes appending a header to the packets that includes transmission management information. In an illustrative embodiment the header can include information used for error detection, such as a checksum. Any suitable header may be used. In some embodiments, the input data 305 is not broken into packets.

The stream of data generated by the data packet generator 315 can be sent to the outer encoder 320. The outer encoder 320 can encrypt or encode the stream using any suitable cypher or code. Any suitable type of encryption can be used such as symmetric key encryption. In an illustrative embodiment, the encryption key is stored on memory associated with the magnio transmitter 310. In an illustrative embodiment, the magnio transmitter 310 may not include the outer encoder 320. For example, the messages may not be encrypted. In an illustrative embodiment, the outer encoder 320 separates the stream into multiple channels. In an illustrative embodiment, the outer encoder outer encoder 320 performs forward error correction (FEC). In some embodiments, the forward error correction dramatically increases the reliability of transmissions for a given power level.

In an illustrative embodiment, the encoded stream from the outer encoder 320 is sent to the interleaver 325. In an illustrative embodiment, the interleaver 325 interleaves bits within each packet of the stream of data. In such an embodiment, each packet has the same bits, but the bits are shuffled according to a predetermined pattern. Any suitable interleaving method can be used. In an alternative embodiment, the packets are interleaved. In such an embodiment, the packets are shuffled according to a predetermined pattern. In some embodiments, the magnio transmitter 310 may not include the interleaver 325.

In some embodiments, interleaving data can be used to prevent loss of a sequence of data. For example, if a stream of bits are in sequential order and there is a communication loss during a portion of the stream, there is a relatively large gap in the information corresponding to the lost bits. However, if the bits were interleaved (e.g., shuffled), once the stream is de-interleaved (e.g., unshuffled) at the receiver, the lost bits are not grouped together but are spread across the sequential bits. In some instances, if the lost bits are spread across the message, error correction can be more successful in determining what the lost bits were supposed to be.

In an illustrative embodiment, the interleaved stream from the interleaver 325 is sent to the inner encoder 330. The inner encoder 330 can encrypt or encode the stream using any suitable cypher or code. Any suitable type of encryption can be used such as symmetric key encryption. In an illustrative embodiment, the encryption key is stored on memory associated with the magnio transmitter 310. In an illustrative embodiment, the magnio transmitter 310 may not include the inner encoder 330. In an illustrative embodiment, the inner encoder 330 and the outer encoder 320 perform different functions. For example, the inner encoder 330 can use a deep convolutional code and can perform most of the forward error correction, and the outer encoder can be used to correct residual errors and can use a different coding technique from the inner encoder 330 (e.g., a block-parity based encoding technique).

In an illustrative embodiment, the encoded stream from the inner encoder 330 is sent to the interleaver 335. In an illustrative embodiment, the interleaver 335 interleaves bits within each packet of the stream of data. In such an embodiment, each packet has the same bits, but the bits are shuffled according to a predetermined pattern. Any suitable interleaving method can be used. In an alternative embodiment, the packets are interleaved. In such an embodiments, the packets are shuffled according to a predetermined pattern. In an illustrative embodiment, interleaving the data spreads out burst-like errors across the signal, thereby facilitating the decoding of the message. In some embodiment, the magnio transmitter 310 may not include the interleaver 335.

In an illustrative embodiment, the interleaved stream from the interleaver 335 is sent to the output packet generator 340. The output packet generator 340 can generate the packets that will be transmitted. For example, the output packet generator 340 may append a header to the packets that includes transmission management information. In an illustrative embodiment the header can include information used for error detection, such as a checksum. Any suitable header may be used.

In an illustrative embodiment, the output packet generator 340 appends a synchronization sequence to each of the packets. For example, a synchronization sequence can be added to the beginning of each packet. The packets can be transmitted on multiple channels. In such an embodiment, each channel is associated with a unique synchronization sequence. The synchronization sequence can be used to decipher the channels from one another, as is discussed in greater detail below with regard to the magnio receiver 360.

In an illustrative embodiment, the output packet generator 340 modulates the waveform to be transmitted. Any suitable modulation can be used. In an illustrative embodiment, the waveform is modulated digitally. In some embodiments, minimum shift keying can be used to modulate the waveform. For example, non-differential minimum shift key can be used. In an illustrative embodiment, the waveform has a continuous phase. That is, the waveform does not have phase discontinuities. In an illustrative embodiment, the waveform is sinusoidal in nature.

In an illustrative embodiment, the modulated waveform is sent to the transmitter 345. In an illustrative embodiment, multiple modulated waveforms are sent to the transmitter 345. As mentioned above, two, three, or four signals can be transmitted simultaneously via magnetic fields with different directions. In an illustrative embodiment, three modulated waveforms are sent to the transmitter 345. Each of the waveforms can be used to modulate a magnetic field, and each of the magnetic fields can be orthogonal to one another.

The transmitter 345 can use the received waveforms to produce the modulated magnetic field 350. The modulated magnetic field 350 can be a combination of multiple magnetic fields of different directions. The frequency used to modulate the modulated magnetic field 350 can be any suitable frequency. In an illustrative embodiment, the carrier frequency of the modulated magnetic field 350 can be 10 kHz. In alternative embodiments, the carrier frequency of the modulated magnetic field 350 can be less than or greater than 10 kHz. In some embodiments, the carrier frequency can be modulated to plus or minus the carrier frequency. That is, using the example in which the carrier frequency is 10 kHz, the carrier frequency can be modulated down to 0 Hz and up to 20 kHz. In alternative embodiments, any suitable frequency band can be used.

Figure 4B:
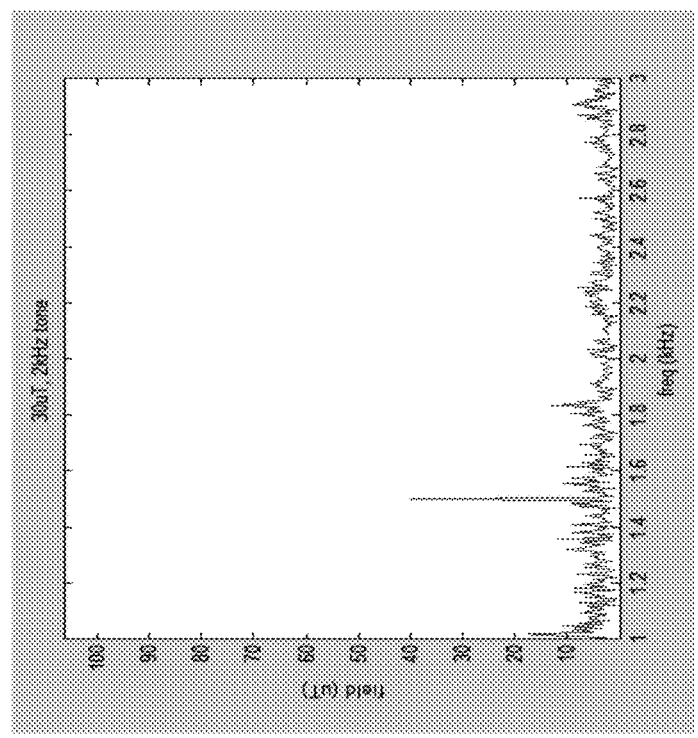
FIGS. 4A and 4B show the strength of a magnetic field versus frequency in accordance with an illustrative embodiment.
Figure 4A:
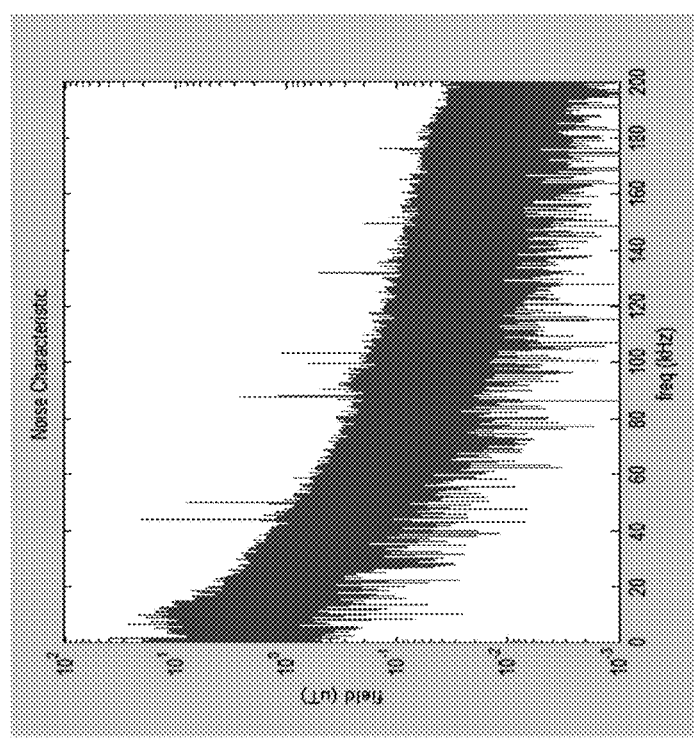

FIGS. 4A and 4B show the strength of a magnetic field versus frequency in accordance with an illustrative embodiment. FIGS. 4A and 4B are meant to be illustrative only and not meant to be limiting. In some instances, the magnetic spectrum is relatively noisy. As shown in FIG. 4A, the noise over a large band (e.g., 0-200 kHz) is relatively high. Thus, communicating over such a large band may be difficult. FIG. 4B illustrates the noise over a smaller band (e.g., 1-3 kHz). As shown in FIG. 4B, the noise over a smaller band is relatively low. Thus, modulating the magnetic field across a smaller band of frequencies can be less noisy and more effective. In an illustrative embodiment, the magnio transmitter 310 can monitor the magnetic field and determine a suitable frequency to modulate the magnetic fields to reduce noise. That is, the magnio transmitter 310 can find a frequency that has a high signal to noise ratio. In an illustrative embodiment, the magnio transmitter 310 determines a frequency band that has noise that is below a predetermined threshold.

In an illustrative embodiment, the magnio receiver 360 includes the demodulator 365, the de-interleaver 370, the soft inner decoder 375, the de-interleaver 380, the outer decoder 385, and the output data generator 390. In alternative embodiments, additional, fewer, and/or different elements may be used. For example, the magnio receiver 360 can include the magnetometer 355 in some embodiments. The various components of the magnio receiver 360 are illustrated in FIG. 3 as individual components and are meant to be illustrative only. However, in alternative embodiments, the various components may be combined. Additionally, the use of arrows is not meant to be limiting with respect to the order or flow of operations or information. Any of the components of the magnio receiver 360 can be implemented using hardware and/or software.

The magnetometer 355 is configured to measure the modulated magnetic field 350. In an illustrative embodiment, the magnetometer 355 includes a DNV sensor. The magnetometer 355 can monitor the modulated magnetic field 350 in up to four directions. As illustrated in FIG. 2A, the magnetometer 355 can be configured to measure the magnetometer 355 in one or more of four directions that are tetrahedronally arranged. As mentioned above, the magnetometer 355 can monitor n+1 directions where n is the number of channels that the transmitter 345 transmits on. For example, the transmitter 345 can transmit on three channels, and the magnetometer 355 can monitor four directions. In an alternative embodiment, the transmitter 345 can transmit via the same number of channels (e.g., four) as directions that the magnetometer 355 monitors.

The magnetometer 355 can send information regarding the modulated magnetic field 350 to the demodulator 365. The demodulator 365 can analyze the received information and determine the direction of the magnetic fields that were used to create the modulated magnetic field 350. That is, the demodulator 365 can determine the directions of the channels that the transmitter 345 transmitted on. As mentioned above, the transmitter 345 can transmit multiple streams of data, and each stream of data is transmitted on one channel. Each of the streams of data can be preceded by a unique synchronization sequence. In an illustrative embodiment, the synchronization sequence includes 1023 bits. In alternative embodiments, the synchronization sequence includes more than or fewer than 1023 bits. Each of the streams can be transmitted simultaneously such that each of the channels are time-aligned with one another. The demodulator 365 can monitor the magnetic field in multiple directions simultaneously. Based on the synchronization sequence, which is known to the magnio receiver 360, the demodulator 365 can determine the directions corresponding to the channels of the transmitter 345. When the streams of synchronization sequences are time-aligned, the demodulator 365 can monitor the modulated magnetic field 350 to determine how the multiple channels mixed. Once the demodulator 365 determines how the various channels are mixed, the channels can be demodulated.

For example, the transmitter 345 transmits on three channels, with each channel corresponding to an orthogonal direction. Each channel is used to transmit a stream of information. For purposes of the example, the channels are named "channel A," "channel B," and "channel C." The magnetometer 355 monitors the modulated magnetic field 350 in four directions. The demodulator 365 can monitor for three signals in orthogonal directions. For purposes of the example, the signals can be named "signal 1," "signal 2," and "signal 3." Each of the signals can contain a unique, predetermined synchronization sequence. The demodulator 365 can monitor the modulated magnetic field 350 for the signals to be transmitted on the channels. There is a finite number of possible combinations that the signals can be received at the magnetometer 355. For example, signal 1 can be transmitted in a direction corresponding to channel A, signal 2 can be transmitted in a direction corresponding to channel B, and signal 3 can be transmitted in a direction corresponding to channel C. In another example, signal 2 can be transmitted in a direction corresponding to channel A, signal 3 can be transmitted in a direction corresponding to channel B, and signal 1 can be transmitted in a direction corresponding to channel C, etc. The modulated magnetic field 350 of the synchronization sequence for each of the possible combinations that the signals can be received at the magnetometer 355 can be known by the demodulator 365. The demodulator 365 can monitor the output of the magnetometer 355 for each of the possible combinations. Thus, when one of the possible combinations is recognized by the demodulator 365, the demodulator 365 can monitor for additional data in directions associated with the recognized combination. In another example, the transmitter 345 transmits on two channels, and the magnetometer 355 monitors the modulated magnetic field 350 in three directions.

The demodulated signals (e.g., the received streams of data from each of the channels) is sent to the de-interleaver 370. The de-interleaver 370 can undo the interleaving of the interleaver 335. The de-interleaved streams of data can be sent to the soft inner decoder 375, which can undo the encoding of the inner encoder 330. Any suitable decoding method can be used. For example, in an illustrative embodiment the inner encoder 330 uses a three-way, soft-decision turbo decoding function. In an alternative embodiment, a two-way, soft-decision turbo decoding function may be used. For example, the expected cluster positions for signal levels are learned by the magnio receiver 360 during the synchronization portion of the transmission. When the payload/data portion of the transmission is processed by the magnio receiver 360, distances from all possible signal clusters to the observed signal value are computed for every bit position. The bits in each bit position are determined by combining the distances with state transition probabilities to find the best path through a "trellis." The path through the trellis can be used to determine the most likely bits that were communicated.

The decoded stream can be transmitted to the de-interleaver 380. The de-interleaver 380 can undo the interleaving of the interleaver 325. The de-interleaved stream can be sent to the outer decoder 385. In an illustrative embodiment, the outer decoder 385 undoes the encoding of the outer encoder 320. The unencoded stream of information can be sent to the output data generator 390. In an illustrative embodiment, the output data generator 390 undoes the packet generation of data packet generator 315 to produce the output data 395.

Figure 5:
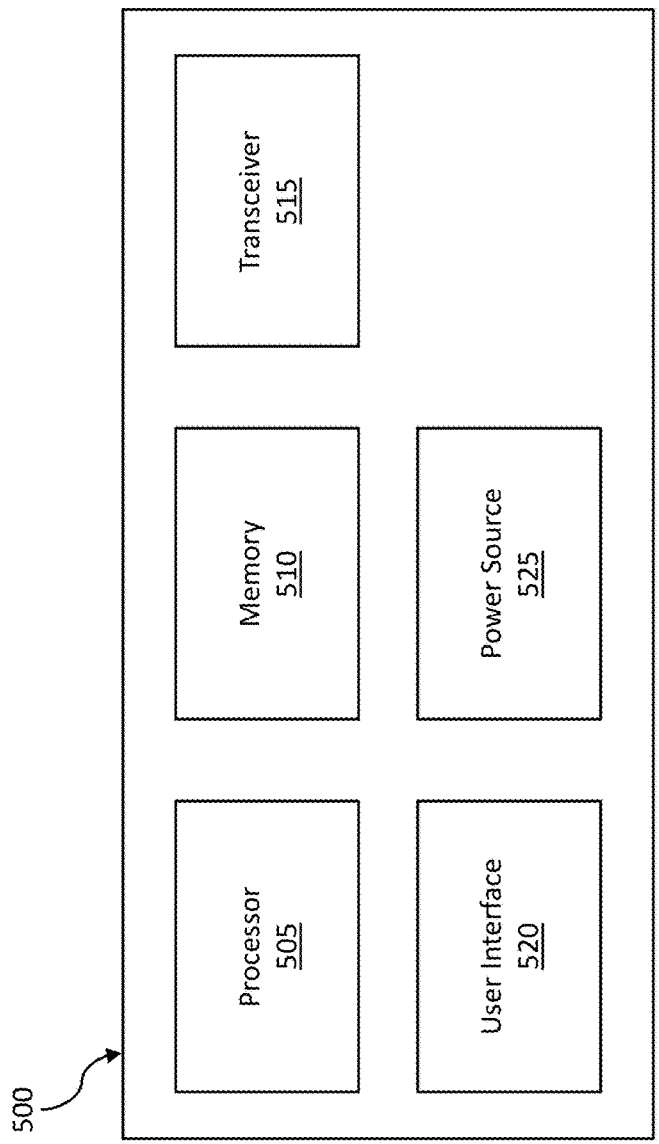
FIG. 5 is a block diagram of a computing device in accordance with an illustrative embodiment.

FIG. 5 is a block diagram of a computing device in accordance with an illustrative embodiment. An illustrative computing device 500 includes a memory 510, a processor 505, a transceiver 515, a user interface 520, and a power source 525. In alternative embodiments, additional, fewer, and/or different elements may be used. The computing device 500 can be any suitable device described herein. For example, the computing device 500 can be a desktop computer, a laptop computer, a smartphone, a specialized computing device, etc. The computing device 500 can be used to implement one or more of the methods described herein.

In an illustrative embodiment, the memory 510 is an electronic holding place or storage for information so that the information can be accessed by the processor 505. The memory 510 can include, but is not limited to, any type of random access memory (RAM), any type of read only memory (ROM), any type of flash memory, etc. such as magnetic storage devices (e.g., hard disk, floppy disk, magnetic strips, etc.), optical disks (e.g., compact disk (CD), digital versatile disk (DVD), etc.), smart cards, flash memory devices, etc. The computing device 500 may have one or more computer-readable media that use the same or a different memory media technology. The computing device 500 may have one or more drives that support the loading of a memory medium such as a CD, a DVD, a flash memory card, etc.

In an illustrative embodiment, the processor 505 executes instructions. The instructions may be carried out by a special purpose computer, logic circuits, or hardware circuits. The processor 505 may be implemented in hardware, firmware, software, or any combination thereof. The term "execution" is, for example, the process of running an application or the carrying out of the operation called for by an instruction. The instructions may be written using one or more programming language, scripting language, assembly language, etc. The processor 505 executes an instruction, meaning that it performs the operations called for by that instruction. The processor 505 operably couples with the user interface 520, the transceiver 515, the memory 510, etc. to receive, to send, and to process information and to control the operations of the computing device 500. The processor 505 may retrieve a set of instructions from a permanent memory device such as a ROM device and copy the instructions in an executable form to a temporary memory device that is generally some form of RAM. An illustrative computing device 500 may include a plurality of processors that use the same or a different processing technology. In an illustrative embodiment, the instructions may be stored in memory 510.

In an illustrative embodiment, the transceiver 515 is configured to receive and/or transmit information. In some embodiments, the transceiver 515 communicates information via a wired connection, such as an Ethernet connection, one or more twisted pair wires, coaxial cables, fiber optic cables, etc. In some embodiments, the transceiver 515 communicates information via a wireless connection using microwaves, infrared waves, radio waves, spread spectrum technologies, satellites, etc. The transceiver 515 can be configured to communicate with another device using cellular networks, local area networks, wide area networks, the Internet, etc. In some embodiments, one or more of the elements of the computing device 500 communicate via wired or wireless communications. In some embodiments, the transceiver 515 provides an interface for presenting information from the computing device 500 to external systems, users, or memory. For example, the transceiver 515 may include an interface to a display, a printer, a speaker, etc. In an illustrative embodiment, the transceiver 515 may also include alarm/indicator lights, a network interface, a disk drive, a computer memory device, etc. In an illustrative embodiment, the transceiver 515 can receive information from external systems, users, memory, etc.

In an illustrative embodiment, the user interface 520 is configured to receive and/or provide information from/to a user. The user interface 520 can be any suitable user interface. The user interface 520 can be an interface for receiving user input and/or machine instructions for entry into the computing device 500. The user interface 520 may use various input technologies including, but not limited to, a keyboard, a stylus and/or touch screen, a mouse, a track ball, a keypad, a microphone, voice recognition, motion recognition, disk drives, remote controllers, input ports, one or more buttons, dials, joysticks, etc. to allow an external source, such as a user, to enter information into the computing device 500. The user interface 520 can be used to navigate menus, adjust options, adjust settings, adjust display, etc.

The user interface 520 can be configured to provide an interface for presenting information from the computing device 500 to external systems, users, memory, etc. For example, the user interface 520 can include an interface for a display, a printer, a speaker, alarm/indicator lights, a network interface, a disk drive, a computer memory device, etc. The user interface 520 can include a color display, a cathode-ray tube (CRT), a liquid crystal display (LCD), a plasma display, an organic light-emitting diode (OLED) display, etc.

In an illustrative embodiment, the power source 525 is configured to provide electrical power to one or more elements of the computing device 500. In some embodiments, the power source 525 includes an alternating power source, such as available line voltage (e.g., 120 Volts alternating current at 60 Hertz in the United States). The power source 525 can include one or more transformers, rectifiers, etc. to convert electrical power into power useable by the one or more elements of the computing device 500, such as 1.5 Volts, 8 Volts, 12 Volts, 24 Volts, etc. The power source 525 can include one or more batteries.

In an illustrative embodiment, any of the operations described herein can be implemented at least in part as computer-readable instructions stored on a computer-readable memory. Upon execution of the computer-readable instructions by a processor, the computer-readable instructions can cause a node to perform the operations.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A system comprising:
   a transmitting device comprising:
      a first processor configured to transmit data to a transmitter, wherein the data comprises a plurality of data streams with unique synchronization sequences therein; and
      the transmitter, wherein the transmitter is configured to transmit the data via a magnetic field, wherein each of the data streams is simultaneously transmitted on a respective one of a plurality of channels, and wherein each of the plurality of channels comprises a unique direction of the magnetic field; and
   a receiving device comprising:
      a magnetometer configured to detect the magnetic field and generate a signal indicative of the detected magnetic field; and
      a second processor receiving the signal indicative of the detected magnetic fields and monitoring the signal for a plurality of combinations of the unique synchronization sequences, and wherein each of the combinations comprises one of the unique synchronization sequences on a respective one of the plurality of channels; wherein the data from the detected magnetic field may be deciphered based at least in part on an identification of one of the plurality of combinations of the unique synchronization sequences on the plurality of channels.

2. The system of claim 1, wherein the first processor is further configured to:
   receive a first data stream comprising the data; and
   interleave the data into a plurality of second data streams, and
   wherein the transmitter is configured to transmit each of the second data streams on one of the plurality of channels.

3. The system of claim 2, wherein each of the plurality of channels comprises one of a plurality of magnetic fields.

4. The system of claim 3, wherein each of the plurality of magnetic fields is orthogonal to one another.

5. The system of claim 2, wherein the magnetometer is configured to detect the magnetic field in a plurality of directions.

6. The system of claim 5, wherein the plurality of directions are tetrahedrally arranged.

7. The system of claim 5, wherein the signal indicative of the magnetic field comprises a plurality of signals from the magnetometer, wherein each of the plurality of signals corresponds to one of the plurality of directions, and wherein the second processor is configured to:
   decipher each of the plurality of second data streams from the plurality of signals; and
   de-interleave the plurality of second data streams to determine the data.

8. The system of claim 1, wherein the plurality of channels is two channels, and wherein each of the two channels corresponds to one of two magnetic fields.

9. The system of claim 8, wherein the magnetometer is configured to detect each of three magnetic fields.

10. The system of claim 1, wherein the plurality of channels is three channels, and wherein each of the three channels corresponds to one of three magnetic fields.

11. The system of claim 10, wherein the magnetometer is configured to detect each of four magnetic fields.

12. A device comprising:
   a processor configured to:
      receive a stream of data, and
      encode the stream of data into a plurality of streams of data with unique synchronization sequences therein; and
   a transmitter configured to:
      receive the plurality of streams of data, and
      simultaneously transmit the plurality of streams of data via a plurality of magnetic fields such that each of the unique synchronization sequences are time-aligned, wherein each of the plurality of streams is transmitted via a corresponding one of the plurality of magnetic fields.

13. The device of claim 12, wherein the plurality of streams of data is three streams of data, and wherein the plurality of magnetic fields is three magnetic fields.

14. The device of claim 13, wherein the plurality of magnetic fields are orthogonal to one another.

15. The device of claim 12, wherein the transmitter further comprises a plurality of coils, and wherein each of the plurality of magnetic fields is generated by a corresponding one of the plurality of coils.

16. The device of claim 12, wherein each of the plurality of magnetic fields corresponds to one of a plurality of transmission channels.

\* \* \* \* \*